United States Patent
Chan et al.

(10) Patent No.: US 8,631,059 B2
(45) Date of Patent: Jan. 14, 2014

(54) METHODS OR STRUCTURES FOR RECONSTRUCTION OF SUBSTANTIALLY UNIFORM SAMPLES FROM SUBSTANTIALLY NONUNIFORM SAMPLES

(75) Inventors: Shing Chow Chan, New Territories (HK); Kai Man Tsui, Aberdeen (HK)

(73) Assignee: The University of Hong Kong, Hong Kong (HK)

( * ) Notice: Subject to any disclaimer, the term of this patent is extended or adjusted under 35 U.S.C. 154(b) by 729 days.

(21) Appl. No.: 12/768,635

(22) Filed: Apr. 27, 2010

(65) Prior Publication Data

US 2010/0281090 A1 Nov. 4, 2010

Related U.S. Application Data

(60) Provisional application No. 61/173,945, filed on Apr. 29, 2009.

(51) Int. Cl.
*G06F 17/17* (2006.01)

(52) U.S. Cl.
USPC .......................................... 708/313

(58) Field of Classification Search
None
See application file for complete search history.

(56) References Cited

U.S. PATENT DOCUMENTS

| 5,568,142 | A | 10/1996 | Velazquez et al. | |
| 8,195,972 | B2* | 6/2012 | Renner et al. | 713/401 |
| 2002/0105339 | A1* | 8/2002 | Nagaraj | 324/601 |
| 2011/0131439 | A1* | 6/2011 | Renner et al. | 713/401 |
| 2012/0223850 | A1* | 9/2012 | Su | 341/144 |
| 2012/0274491 | A1* | 11/2012 | Kidambi | 341/118 |

\* cited by examiner

*Primary Examiner* — David H Malzahn
(74) *Attorney, Agent, or Firm* — Berkeley Law & Technology Group, LLP

(57) ABSTRACT

Briefly, embodiments of methods or structures for reconstruction of uniform digital signal sample values from nonuniform digital signal sample values are disclosed.

29 Claims, 7 Drawing Sheets

METHODS OR STRUCTURES FOR RECONSTRUCTION OF SUBSTANTIALLY UNIFORM SAMPLES FROM SUBSTANTIALLY NONUNIFORM SAMPLES

RELATED PATENT APPLICATION

This patent application claims priority to U.S. provisional application Ser. No. 61/173,945, filed Apr. 29, 2009, by Shing Chow Chan and Kai Man Tsui, titled "METHODS OR STRUCTURES FOR RECONSTRUCTION OF UNIFORM SAMPLES FROM NONUNIFORM SAMPLES," assigned to the assignee of the currently claimed subject matter.

FIELD

This disclosure relates generally to resampling in the field of digital signal processing.

BACKGROUND

Sampling of digital signal values occurs in many applications, such as signal, speech and video processing, high-speed data converters, power spectral estimation, etc. Many signal processing processes or display systems work with substantially uniformly spaced samples; however, at times, substantially nonuniform digital signal samples are available, rather than substantially uniform signal samples.

For nonuniform sampling, if a signal to be sampled is assumed to be sampled nonuniformly and periodically, conventional reconstruction methods may involve use of a filter bank structure. One application addresses timing mismatch in time-interleaved (TI) analog-to-digital converters (ADCs).

Assuming, for example, that timing mismatches in TI ADCs are known and fixed, a synthesis filter bank may potentially be realized using time varying finite impulse response (FIR) filters. See, for example, Eldar Y. C. and Oppenheim A. V., "Filterbank reconstruction of bandlimited signals from nonuniform and generalized samples," *IEEE Trans. Signal Process.*, vol. 48, no. 10, pp. 2864-2875, October 2000; H. Johansson and P. Löwenborg, "Reconstruction of nonuniformly sampled bandlimited signals by means of digital fractional delay filters," *IEEE Trans. Signal Process.*, vol. 50, no. 11, pp. 2757-2767, November 2002; and S. Prendergast, B. C. Levy, and P. J. Hurst, "Reconstruction of bandlimited periodic nonuniformly sampled signals through multirate filter banks," *IEEE Trans. Circuits Syst. I, Fundam. Theory Appl.*, vol. 51, no. 8, pp. 1612-1622, August 2004. However, issues may arise if time-skew errors change during operation. This may occur for a variety of reasons, such as component aging, temperature variation, or other reasons, for example. A synthesis filter bank may be redesigned to deal with timing mismatch. However, this may involve the use of general-purpose multipliers, which may tend to increase implementation costs, power consumption at high data rates, or have other disadvantages.

Recently, use of more sophisticated digital filters, such as multivariate polynomial impulse response time varying FIR filters, has been proposed to realize a tunable synthesis filter bank See, for example, H. Johansson, P. Lowenborg, and K. Vengattaramane, "Reconstruction of M-periodic nonuniformly sampled signals using multivariate polynomial impulse response time-varying FIR filters," in *Proc. XII Eur. Signal Process. Conf.*, Florence, Italy, Sep. 4-8, 2006; and S. Huang and B. C. Levy, "Blind calibration of timing offset for four-channel time-interleaved ADCs," *IEEE Trans. Circuits Syst. I, Reg. Papers*, vol. 54, no. 4, pp. 863-876, April 2006.

Time-skew errors for different channels may be included in a synthesis filter bank so that a filter response may be adjusted by several tuning variables. From an implementation point of view, a synthesis filter bank may be implemented without multipliers, except for a limited number of tuning variables, which may be advantageous. While relatively successful with a small number of channels or small range of time-skew errors, otherwise issues may exist. For instance, an M-channel TI ADC generally has at least (M−1) synthesis filters which are functions of M variables. Consequently, a design may become challengingly difficult, as M increases. Moreover, high implementation complexity may be another drawback.

Alternate reconstruction methods that do not use a filter bank structure exist for various classes of nonuniformly sampled signals. For example, iterative methods, such as described in F. Marvasti, M. Analoui, and M. Gamshadzahi, "Recovery of signals from nonuniform samples using iterative methods," *IEEE Trans. Signal Process.*, vol. 39, pp. 872-877, April 1991, and E. I. Plotkin, M. N. S. Swamy and Y. Yoganandam, "A novel iterative method for the reconstruction of signals from nonuniformly spaced samples," *Signal Process.*, vol. 37, pp. 203-213, 1994, were commonly used for recovery of nonperiodically sampled signals. However, implementation complexities of these approaches may at times be higher than those of filter banks, making them less attractive in real-time applications, such as TI ADCs. Another disadvantage is a possibility of an ill-behaved system matrix formed by a truncated sinc series, which may result in a relatively low convergence rate or may potentially raise implementation cost.

Another class of parallel ADC arrays called hybrid filter bank (HFB) ADC makes use of analog analysis bank and may be capable of attenuating timing mismatch. See, for example, S. R Velazquez, T. Q. Nguyen and S. R. Broadstone, "Hybrid filter bank analog/digital converter," U.S. Pat. No. 5,568,142, October 1996. Although performance of HFB ADCs may typically be less sensitive to mismatch than conventional TI ADCs, design of accurate frequency-selective analog analysis filters and sophisticated digital synthesis filters may make implementation more complicated.

BRIEF DESCRIPTION OF THE FIGURES

Non-limiting and non-exhaustive embodiments will be described with reference to the following figures, wherein like reference numerals refer to like parts throughout various figures unless otherwise specified.

DETAILED DESCRIPTION

In the following description of embodiments, reference is made to accompanying drawings which form a part hereof, and in which it is shown by way of illustration specific embodiments of claimed subject matter. It is to be understood that other embodiments may be used; for example, changes or alterations, such as structural changes, may be made. Embodiments, changes or alterations, such as structural changes, are not intended to be departures from scope with respect to claimed subject matter.

Figure 1A:
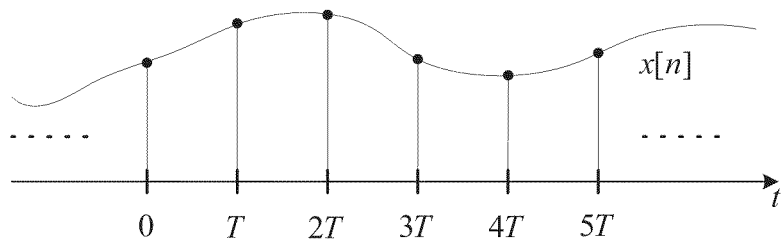
FIGS. 1(a), 1(b), and 1(c), respectively, are two signal plots illustrating uniform sampling and nonuniform sampling of a continuous-time signal, and a block diagram illustrating an embodiment producing signal sample values.
Figure 1B:
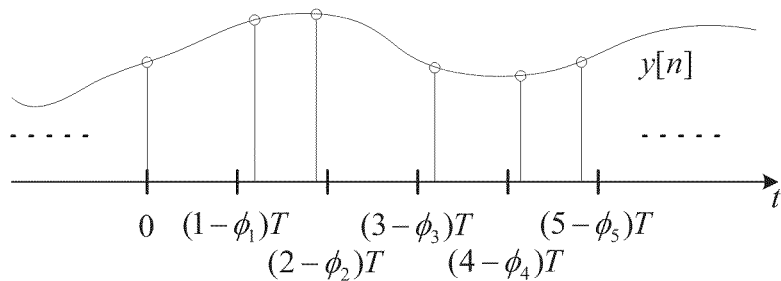
Figure 1C:
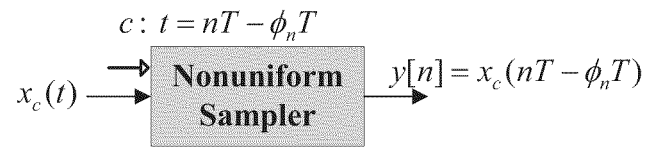

FIG. 1(a) is a signal plot illustrating an example of uniform sampling of a continuous-time (CT) signal $x_c(t)$, where a discrete-time (DT) sequence x[n] is obtained by sampling a signal at regular intervals using an ADC. Sequence x[n] comprises a series of digital signal sample values. FIG. 1(b) is a signal plot illustrating an example of nonuniform sampling of $x_c(t)$, where a DT sequence y[n] is defined as $y[n]=x_c(nT-\phi_n T)$; T comprises a sampling interval and $|\phi_n|\leq 0.5$. FIG. 1(c) shows a block diagram of one embodiment to generate y[n] from $x_c(t)$ via a nonuniform sampler. Again, sequence y[n] comprises a series of digital signal sample values. In some situations, it may be desirable to have the ability to determine x[n] from y[n]. On the other hand, a reverse problem (e.g., to compute a set of nonuniform samples from a uniformly sampled sequence of digital signal sample values) may also be encountered in sampling rate conversion. In what follows, we shall first introduce the reverse problem and provide an example implementation of an embodiment for addressing. Likewise, from this particular embodiment, we shall also demonstrate an example implementation for addressing the forward problem. Of course, claimed subject matter is not intended to be limited to these example embodiments or implementations. These are provided for illustration purposes. Therefore, it is intended that subject matter of the present application encompass much more than these illustrative examples.

Assuming that $x_c(t)$ has a frequency limit $f_{max}$ and a sampling rate $f_s=1/T$ applied to $x_c(t)$ is greater than the Nyquist rate $2f_{max}$, according to sampling theorem, a substantially nonuniformly sampled sequence y[n] may be expressed in terms of a substantially uniformly sampled sequence x[n] as $$y[n] = x_c(nT - \phi_n T) = \sum_{k=-\infty}^{\infty} x[k]\cdot \text{sinc}(n - \phi_n - k), \forall n. \qquad (1)$$

For purposes of this patent application, the term "substantially" is in general understood to be included through out the specification, even in situations where the term is not expressly employed. As simply one example, uniformly sampled sequences are understood to include substantially uniformly sampled sequences. If $\phi_n$ is given, y[n] may comprise a delayed version of a uniform sampled sequence x[n]. From (1), a DT impulse response of a fractional delay operation may be expressed as $$h_{ideal}[n_0,\phi]=\text{sinc}(n_0-\phi), n_0=\ldots,-1,0,1,\ldots, \qquad (2)$$

and a discrete-time Fourier transform (DTFT) of $h_{ideal}[n,\phi]$ may comprise:

$$H_{ideal}(e^{j\omega},\phi)=e^{-j\omega\phi}, \omega\in[-\pi,\pi]. \qquad (3)$$

As seen in (2), an ideal delay operation may be represented since it has impulse response with infinite length. Appropriate approximation to $h_{ideal}[n_0, \phi]$ is considered below.

In conventional iterative methods, an infinite sine series may be truncated to approximate an ideal fractional delay operation, such as in (2). However, due at least in part to slow decay of the sinc function, truncation error for an approximation may at times be substantial. As a common practice, it may be assumed that a continuous-time signal $x_c(t)$ is slightly oversampled, and hence a DTFT of x[n] is zero for $\alpha\pi \leq |\omega|\leq \pi$, $0<\alpha<1$. This assumption permits one to relax specification of $H_{ideal}(e^{j\omega}, \phi)$ as follows:

$$H_{ideal}(e^{j\omega},\phi)=e^{-j\omega\phi}, \omega\in[-\alpha\pi,\alpha\pi]. \qquad (4)$$

Let $h[n_0,\phi]$ be a corresponding approximation of an ideal impulse response $h_{ideal}[n_0,\phi]$. Assume that a frequency response of $h[n_0,\phi]$ is designed to approximate $H_{ideal}(e^{j\omega},\phi)$ in a frequency band of interest, Eqn. (1) may be rewritten as $$y[n] \approx \sum_{k=n-N_{h2}}^{n+N_{h1}} x[k]\cdot h[n-k,\phi_n], \forall n. \qquad (5)$$

where, $N_{h1}$ and $N_{h2}$ are positive integers. Let us now consider two possible cases.

Case 1: $N_{h1}$ and $N_{h2}$ are finite; $h[n_0,\phi]$ may be realized as a FIR filter parameterized by fractional delay $\phi_n$.

Case 2: $N_{h1}$ is finite and $N_{h2}$ are infinite; $h[n_0,\phi]$ may be realized as an IIR filter parameterized by fractional delay $\phi_n$. Now let us consider a matrix form of (5):

$$y=Ax, \qquad (6)$$

where $y=[y[-\infty], \ldots, y[\infty]]^T$, $x=[x[-\infty], \ldots, x[\infty]]^T$ and $[A]_{n,k}=a_{n,k}=h[n-k,\phi_n]$, for $n,k=\ldots,-1,0,1,\ldots$.

One challenge may be to recover a uniform sequence x, given its nonuniform counterpart y. For example, it may be desired to process a system of linear equations in (7), provided below. For sake of presentation, $\{y[n]\}$ and $\{x[n]\}$ are assumed to be DT signals with a finite but sufficiently large number of digital signal samples values. Thus, y and x may be described in this particular embodiment as (N×1) vectors and A comprises (N×N) matrix. Also, $h[n_0,\phi_n]$ is assumed to be noncausal, although, of course, claimed subject matter is not limited in scope in this respect. Furthermore, for implementation purposes, introducing appropriate delays may be provided.

Matrix A may have characteristics, such as: (i) Assuming that $\phi_n \in (-0.5, 0.5)$, A is nonsingular. (ii) A effectively comprises a banded matrix because $h[n_0,\phi_n]$ is zero for $n_0<-N_{h1}$ and $n_0>N_{h2}$. (iii) Since $h[n_0,\phi_n]$ tends to zero as $|n_0|$ increases, absolute values of diagonal elements of A are greater than those of other off-diagonal elements. For small $\phi_n$, A comprises a diagonally dominant matrix (e.g., $|a_{n,n}|>\Sigma_{n\neq k}|a_{n,k}|$, for all n).

For high-speed applications, directly inverting A to find x may be undesirable at least partially due to computational complexity. However, it is noted that A exhibits a relatively sparse structure. Therefore, one may have the ability to determine x using iterative methods. Various iterative methods have been studied; see, for example, Y. Saad, "Iterative methods for sparse linear systems," Boston, Mass.: *PWS Publ.*, Company, 1996. For implementation, methods which may be realized in a sample-by-sample manner, for example, may provide a desirable approach. Many may take a form $$x^{(m+1)} = Gx^{(m)} + f, \quad (7)$$

where G and f are derived from A and y, and $x^{(m)}$ denotes a solution in an m-th iteration.

We next consider partitioning A to form G. For example, let's define a decomposition: A=D−L−U, where D, −L and −U are respectively diagonal negative strictly lower triangular and diagonal negative strictly upper triangular parts of matrix A. Iterative methods may include, without limitation, for example:

(i) Richardson Iteration (RI):

With G=I−μA and f=μy for some μ, component-wise form may be given by:

$$x^{(m+1)}[n] = x^{(m)}[n] + \mu\left(y[n] - \sum_{k=n-N_{h2}}^{n+N_{h1}} x^{(m)}[k] \cdot h[n-k, \phi_n]\right),$$

$$n = 0, \ldots, N-1.$$

(ii) Jacobi Iteration (JI):

With $G=D^{-1}(L+U)$ and $f=D^{-1}y$, component-wise form may be given by:

$$x^{(m+1)}[n] = h[0, \phi_n]^{-1}\begin{pmatrix} y[n] - \\ \sum_{k=n-N_{h2}}^{n-1} x^{(m)}[k] \cdot h[n-k, \phi_n] - \\ \sum_{k=n+1}^{n+N_{h1}} x^{(m)}[k] \cdot h[n-k, \phi_n] \end{pmatrix}, n = 0, \ldots, N-1.$$

(iii) Gauss-Seidel Iteration (GSI):

With $G=(D-L)^{-1}U$ and $f=(D-L)^{-1}y$, component-wise form may be given by:

$$x^{(m+1)}[n] = h[0, \phi_n]^{-1}\begin{pmatrix} y[n] - \\ \sum_{k=n-N_{h2}}^{n-1} x^{(m+1)}[k] \cdot h[n-k, \phi_n] - \\ \sum_{k=n+1}^{n+N_{h1}} x^{(m)}[k] \cdot h[n-k, \phi_n] \end{pmatrix}, n = 0, \ldots, N-1.$$

Alternatively, other similar iterative methods may be used as well. As just one additional example, successive over relaxation may be applied. Therefore, claimed subject matter is not limited in scope to application of any particular method of iterating or iterative partitioning or decomposition.

It should be noted that iterative methods such as described in F. Marvasti, M. Analoui, and M. Gamshadzahi, "Recovery of signals from nonuniform samples using iterative methods," *IEEE Trans. Signal Process.*, vol. 39, pp. 872-877, April 1991; E. I. Plotkin, M. N. S. Swamy and Y. Yoganandam, "A novel iterative method for the reconstruction of signals from nonuniformly spaced samples," *Signal Process.*, vol. 37, pp. 203-213, 1994; and F. Marvasti, *Nonuniform Sampling, Theory and Practice*. Norwell, Mass.: Kluwer, 2001 are similar to RI. However, in a particular embodiment, a system matrix may be formed by truncating a sinc series. A matrix entry may be nonzero for $\phi_n \neq 0$. However, matrix multiplications with a large batch of digital signal sample values may be involved to recover one uniform sample, making them less attractive in real-time applications, such as TI ADCs. Another disadvantage may be an ill-behaved system matrix formed by a truncated sinc series, which may result in a lower convergence rate or potentially raise implementation cost.

Two embodiments to approximate an ideal fractional delay operation are provided, although claimed subject matter is not limited in scope to these two approaches alone. One simple approach may include approximating a fractional delay operation as in (5) by a digital FIR filter with fixed coefficients. A possible or potential drawback may be determining $h[n_0, \phi_n]$ for various values of $\phi_n$, which may make real-time applications more challenging to implement.

Another alternative, however, may include employing so-called variable digital filters (VDFs) or, more appropriately, variable fractional delay digital filters (VFDDFs). In a VFDDF, digital signal sample values at fractional sampling intervals may be computed by tuning a parameter, known as a tuning or spectral parameter. An ideal zero-phase response may be substantially identical to (4), where, in contrast to fixed filter coefficients, tuning parameter φ may be assumed to vary in a finite interval, such as (−0.5,0.5), for example. Therefore, the amount of delay of a desired VFDDF output may be continually adjusted by changing φ. In one example embodiment, an impulse response of a VFDDF may comprise polynomial in φ, although claimed subject matter is not limited in scope to employing only a polynomial approach. For one particular embodiment or sample implementation:

$$h[n_0, \phi] = \sum_{l=0}^{L-1} h_l[n_0] \cdot \phi^l, n_0 = -N_{h1}, \ldots, 0, \ldots, N_{h2}. \quad (8)$$

in which L comprises the number of sub-filters and $h_l[n_0]$ comprises an impulse response of an l-th sub filter.

If $N_{h1}=N_{h2}=N_h$ for some finite positive integer $N_h$ and $h[0,\phi]$ is chosen as the center of symmetry of the impulse response if φ=0, $h[n_0, \phi]$ may exhibit coefficient symmetry, such as: $h[n_0,\phi]=h[-n_0,-\phi]$, $n_0=-N_h, \ldots, 0, \ldots, N_h$. Subfilter coefficients $h_l[n_0]$ may also satisfy $h_l[n_0]=(-1)^l h_l[-n_0]$, $n_0=-N_h, \ldots, 0, \ldots, H_h$, l=0, ..., L−1. Complexity of a design or implementation of an VFDDF, for such an embodiment, for example, may be reduced approximately by a factor of two. VFDDF may be referred to as a linear-phase FIR VFDDF, for example.

One potential or possible disadvantage of an embodiment or approach employing VDFs or VFDDFs may be that coefficients of $h[n_0, \phi_n]$ may change with time instant n. Therefore, multipliers may be included in an implementation. High implementation complexity or power consumption which at times may be associated with general-purpose multipliers, however, may be typically undesirable for high-speed real-time applications. Nonetheless, in one embodiment, as explained in more detail below, an iterative method may be implemented where the number of general purpose multipliers is limited, providing more desirable results. Although claimed subject matter is not limited in scope to a particular embodiment, a Farrow structure may be utilized in at least one embodiment, as described in more detail below.

For example, it may be possible to write RI as:

$$x^{(m+1)} = x^{(m)}[n] + \mu e^{(m)}[n], n = 0, \ldots, N-1, \quad (9)$$

where $e^{(m)}[n] = y[n] - y^{(m)}[n]$ and $$y^{(m)}[n] = \sum_{k=n-N_{h2}}^{n+N_{h1}} x^{(m)}[k]h[n-k, \phi_n].$$

RI may, therefore be implemented by digital filtering to obtain $y^{(m)}[n]$. We begin with a derivation of an transfer operation between input signal sample values and output signal sample values for $x^{(m)}[n]$ and $y^{(m)}[n]$. According to (8) and (9), we have $$H_{RI}(z, \phi) = H(z, \phi) \qquad (10)$$

$$= \sum_{l=0}^{L-1} H_l(z)\phi^l$$

$$= \sum_{l=0}^{L-1} \left[ \sum_{n_0=-N_{h1}}^{N_{h2}} h_l[n_0]z^{-n} \right] \phi^l,$$

where $H_l(z)$ comprises a z-transform of l-th subfilters. Note for Case 1 wherein $N_{h2}$, is finite, $H_{R1}$, $(z,\phi)$ comprises an FIR VDF. On the other hand, for Case 2 where $N_{h2}$ is infinite, $H_{R1}(z,\phi)$ comprises an IIR VDF. Of course, again, these are examples and claimed subject matter is not limited in scope in these respects necessarily.

Figure 2:
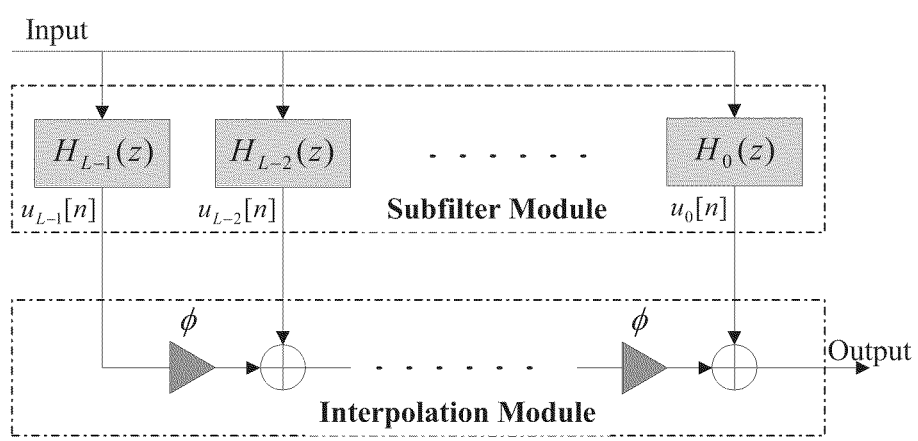
FIG. 2 is a block diagram illustrating an embodiment of a Farrow structure for an example implementation of a variable digital filter.

FIG. 2 is a block diagram of an example implementation of an embodiment of a Farrow structure used to implement a VDF. For example, referring to (10), an implementation may employ L subfilters $H_l(z)$ and a tuning parameter $\phi$. In a subfilter module, subfilter output sequences of digital signal sample values $u_l[n]$ may be obtained by filtering a DT input sequence of digital signal sample values using subfilters $H_l(z)$, $l=0, \ldots, L-1$, respectively. In an interpolation module, an output sequence of digital signal sample values may be given by the value of a polynomial of degree L−1 evaluated at a given $\phi$, where coefficients in ascending powers of a polynomial are given by subfilter output sequences of digital signal sample values $u_l[n]$. Again, claimed subject matter is, of course, not limited in scope to a particular embodiment. Nonetheless, as one example, a subfilter module of a Farrow structure may include digital filters with fixed coefficients. It may, therefore, in at least one embodiment, be implemented using sum-of-power-of-two (SOPOT) coefficients or canonical signed digits to replace general-purpose multipliers. See, for example, Y. C. Lim and S. R. Parker, "FIR filter design over a discrete power-of-two coefficient space," *IEEE Trans. ASSP*-31, pp. 583-591, April 1983. In addition, if subfilters are implemented in transposed form, redundancy in realizing multiplications of SOPOT coefficients may also be reduced by a multiplier-block technique, which may give rise to an implementation that reduces the number of adders employed. See, for example, A. G. Dempster and M. D. MacLeod, "Use of minimum-adder multiplier blocks in FIR digital filters," *IEEE Trans. Circuits Syst. II*, pp. 569-577, September 1995. A structure may be implemented, such as on an integrated circuit, as one example with a limited number of general purpose multipliers.

Figure 3A:
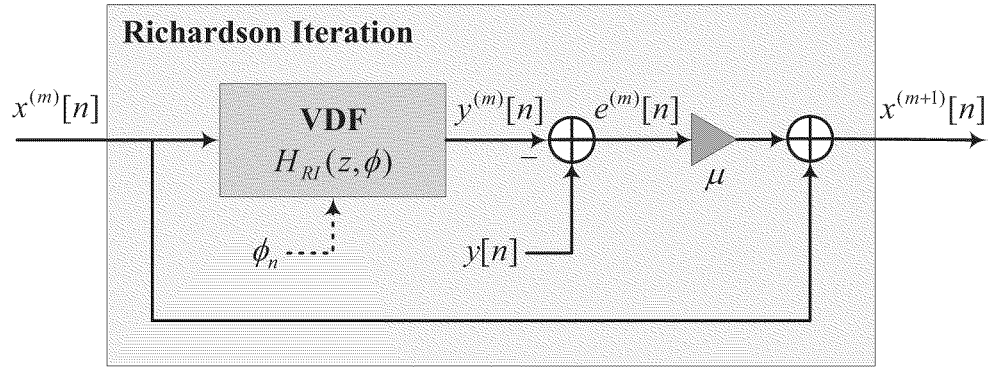
FIGS. 3(a), 3(b) and 3(c) are block diagrams illustrating embodiments of variable digital filter structures for example implementations of Richardson, Jacobi and Gauss-Seidel iterations.

Nonetheless, in other or additional embodiments, additional improvements may additionally be possible, although claimed subject matter is not limited in scope to employing the additional improvements provided below. By substituting an impulse response of a VDF $H_{R1}(z,\phi)$ into (9), $y^{(m)}[n]$ may be provided as a sequence of digital signal sample values of a VDF with appropriate values of $\phi_n$:

$$y^{(m)}[n] = \sum_{l=0}^{L-1} (x^{(m)} * h_l)[n] \cdot \phi_n^l, \qquad (11)$$

where * denotes a discrete-time convolution operation. FIG. 3(a) illustrates one example structure implemention of a VDF of the form of an m-th RI. From a digital signal processing point of view, RI delays a uniform sequence $x^{(m)}[n]$ by $\phi_n$ samples using a VDF to approximate $y^{(m)}[n]$, calculates error digital signal sample values, and updates $x^{(m)}[n]$ to get $x^{(m+1)}[n]$ until error is sufficiently small or a limit on number of iterations is reached.

In an m-th iteration, a particular implementation of RI may comprise:

calculating a sequence $y^{(m)}[n]$ of digital signal sample values by filtering a sequence $x^{(m)}[n]$ of digital signal sample values with L subfilters of a variable digital filter $$H_{RI}(z, \phi) = \sum_{l=0}^{L-1} \left[ \sum_{n_0=-N_{h1}}^{N_{h2}} h_l[n_0]z^{-n} \right] \phi^l,$$

and combining L sequences of digital signal sample values using a Farrow structure with $\phi=\phi_n$ at time instant n, calculating a sequence $e^{(m)}[n]$ of digital signal sample values by subtracting filtered sequence $y^{(m)}[n]$ of digital signal sample values from a nonuniformly sampled sequence $y[n]$ of digital signal sample values, multiplying a sequence $e^{(m)}[n]$ of digital signal sample values with a scalar constant $\mu$, calculating another uniform sequence $x^{(m+1)}[n]$ of digital signal sample values by adding a scaled sequence of digital signal sample values to $x^{(m)}[n]$, and repeating until an error sequence of digital signal sample values is sufficiently small or a number of iterations is reached.

Figure 3B:
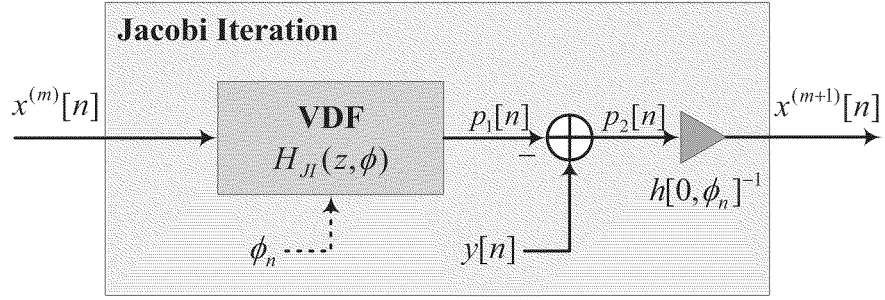
Figure 3C:
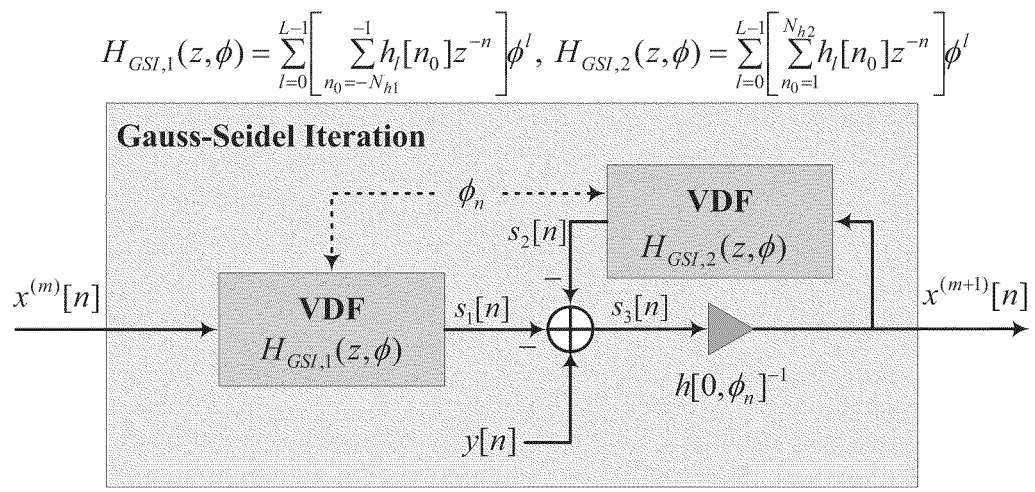

Similarly, FIGS. 3b and 3c illustrate example implementations of structures of VDF-based approaches in the form of an m-th JI and GSI, respectively.

In an m-th iteration, JI comprises:

calculating a sequence $p_1[n]$ of digital signal sample values by filtering a sequence $x^{(m)}[n]$ of digital signal sample values with L subfilters of a variable digital filter $$H_{JI}(z, \phi) = \sum_{l=0}^{L-1} \left[ \sum_{n_0=-N_{h1}, n_0 \neq 0}^{N_{h2}} h_l[n_0]z^{-n} \right] \phi^l,$$

and combining L sequences of digital signal sample values using a Farrow structure with $\phi=\phi_n$ at time instant n, calculating a sequence $p_2[n]$ of digital signal sample values by subtracting a filtered sequence of digital signal sample values from a nonuniformly sampled sequence $y[n]$ of digital signal sample values, calculating a sequence $x^{(m+1)}[n]$ of digital signal sample values by multiplying a subtracted sequence $p_2[n]$ of digital signal sample values with a time-varying constant $h[0,\phi_n]^{-1}$, repeating until an error sequence of digital signal sample values is sufficiently small or a number of iterations is reached.

Note for Case 1 wherein $N_{h2}$, is finite, $H_{J1}(z,\phi)$ comprises an FIR VDF. On the other hand, for Case 2 wherein $N_{h2}$ is infinite, $H_{J1}(z,\phi)$ comprises an IIR VDF.

In an m-th iteration, GSI comprises:
calculating a sequence $s_1[n]$ of digital signal sample values by filtering a sequence $x^{(m)}[n]$ of digital signal sample values with L subfilters of a variable digital filter $$H_{GSI,1}(z,\phi) = \sum_{l=0}^{L-1}\left[\sum_{n_0=-N_{h1}}^{-1} h_l[n_0]z^{-n}\right]\phi^l,$$

and combining L sequences of digital signal sample values using a Farrow structure with $\phi=\phi_n$ at time instant n,
calculating a sequence $s_2[n]$ of digital signal sample values by filtering a sequence $x^{(m+1)}[n]$ of digital signal sample values with L subfilters of a variable digital filter $$H_{GSI,2}(z,\phi) = \sum_{l=0}^{L-1}\left[\sum_{n_0=1}^{N_{h2}} h_l[n_0]z^{-n}\right]\phi^l,$$

and combining L sequences of digital signal sample values using Farrow structure with $\phi=\phi_n$ at time instant n,
calculating a sequence $s_3[n]$ of digital signal sample values by subtracting two filtered sequences $s_1[n]$ and $s_2[n]$ of digital signal sample values from a nonuniformly sampled sequence y[n] of digital signal sample values,
calculating a sequence $x^{(m+1)}[n]$ of digital signal sample values by multiplying a subtracted sequence $s_3[n]$ of digital signal sample values with a time-varying constant $h[0,\phi_n]^{-1}$,
repeating until an error sequence of digital signal sample values is sufficiently small or a number of iterations is reached.

Note for Case 1 wherein $N_{h2}$ is finite, $H_{GSI,2}(z,\phi)$ comprises an FIR VDF. On the other hand, for Case 2 wherein $N_{h2}$ is infinite, $H_{GSI,2}(z,\phi)$ comprises an IIR VDF. In both cases, $H_{GSI,1}(z,\phi)$ may therefore be implemented as a FIR VDF, if desired.

One aspect of iterative methods relates to conditions for convergence. It is known that an iteration in (8) converges for any f and $x^{(0)}$ if and only if (iff) a spectral radius of G, $\rho(G)$, is less than one. However, due at least in part to large N and time-varying parameter $\phi_n$ (and hence A) in general, it may at times be difficult to derive a necessary and sufficient condition based even at least in part on the spectral radius of G.

For RI, for example, using $\rho(G) \leq \|G\|$ for a matrix norm, RI converges for f and $x^{(0)}$ iff $\|G\|<1$ [11]. We shall consider:

$$\|G_\mu\|_\infty = \|I - \mu A\|_\infty$$

$$= \max_{0 \leq n \leq N-1}\left\{\sum_{k=0}^{N-1}|\delta_{n,k} - \mu \cdot a_{n,k}|\right\}$$

$$= \max_{0 \leq n \leq N-1}\left\{\sum_{n_0=-N_{h1}}^{N_{h2}}|g_\mu[n_0,\phi_n]|\right\},$$

where $g_\mu[0,\phi_n]=1-\mu h[0,\phi_n]$ and $g_\mu[n_0,\phi_n]=-\mu h[n_0,\phi_n]$ for $n_0 \neq 0$. Here, we define a cost function or operation:

$$C_1(\mu,\phi_{max}) = \max_{|\phi| \leq \phi_{max}}\left\{\sum_{n_0=-N_{h1}}^{N_{h2}}|g_\mu[n_0,\phi]|\right\}.$$

where $\phi_{max}$, denotes a limit on absolute time-skew error given by $\max\{|\min\{\phi_n\}|,|\max\{\phi_n\}|\}$. For a relatively fast convergence, it would be desirable to find $\mu$ for a given $\phi_{max}$ such that $C_1(\mu,\phi_{max})$ comprises a limited value. Here, conditions for convergence may be handled numerically by considering values of $\mu$ and $\phi_{max}$ that achieve a limited value for $C_1(\mu,\phi_{max})$.

In contrast, for JI and GSI, JI and GSI converge for f and $x^{(0)}$ iff A comprises a diagonally dominant matrix. See, for example, Y. Saad, "Iterative methods for sparse linear systems," Boston, Mass.: *PWS Publ.*, Company, 1996. That is $|a_{n,n}|>\Sigma_{n \neq k}|a_{n,k}|$, for all n, which is equivalent to $$|h[0,\phi_n]| > \sum_{n_0 \neq 0}|h[n_0,\phi_n]|, \text{ for all } \phi_n.$$

We define a cost function:

$$C_2(\phi_{max}) = \max_{|\phi| \leq \phi_{max}}\left\{|h[0,\phi]| - \sum_{n_0 \neq 0}|h[n_0,\phi]|\right\},$$

to check whether A comprises a diagonally dominant matrix for a given $\phi_{max}$.

Experiments have been conducted on several VFDDFs with different conditions being specified. A useful condition for three iteration processes discussed comprises $\phi_{max}$ being at least 0.15. This range of support may be satisfactory for many applications. For example, $\phi_{max}$ is around a few percent of a sampling period in the case of TI ADCs.

In a possible iterative embodiment, reconstruction performance may be assessed using a signal to noise and distortion ratio (SNDR):

$$SNDR = \frac{\sum_n (x[n])^2}{\sum_n (x[n] - x^{(m)}[n])^2}.$$

Figure 4:
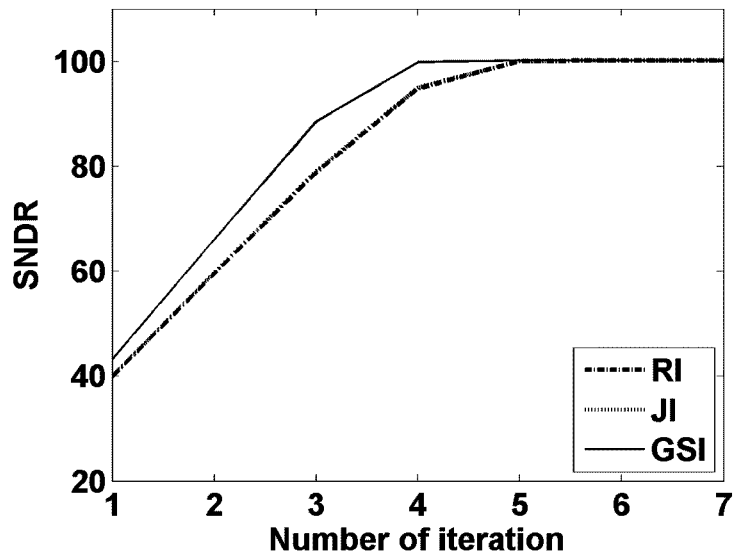
FIG. 4 is a signal plot illustrating reconstruction accuracies of Richardson, Jacobi and Gauss-Seidel iterations with an increasing number of iterations, for randomly distributed time-skew in interval (−0.1,0.1).

For example, although claimed subject matter is not limited in scope in this respect, a VFDDF may be designed, for example, using convex programming, see, for example, K. M. Tsui, S. C. Chan and K. W. Tse, "Design of complex-valued variable digital filters and its application to the realization of arbitrary sampling rate conversions for complex signals," *IEEE Trans. Circuits Syst. II*, vol. 52, issue 7, pp. 424-428, July, 2005, with the following specifications: $N_{h1}=N_{h2}=N_h=35$, number of subfilters L=4, $\omega \in [-0.9\pi,0.9\pi]$, and $\phi \in [-0.1,0.1]$. A sequence of input digital signal sample values may be given by $\Sigma_{k=1}^{10} \cos[nk(0.09\pi)]$ for evaluation. Timing mismatch error $\phi_n$ may be randomly chosen in an interval $(-\phi_{max},\phi_{max})$. FIG. 4 is a signal plot illustrating performances if $\phi_{max}=0.1$, respectively, for various iteration approaches. While GSI offers the fastest convergence rate among the three, RI and JI exhibit similar performances. Generally, SNDR should improve with (i) increased filter order (ii) increased number of subfilters, (iii) reduced passband width, or (iv) reduced tuning range of the VFDDF.

Figure 5:
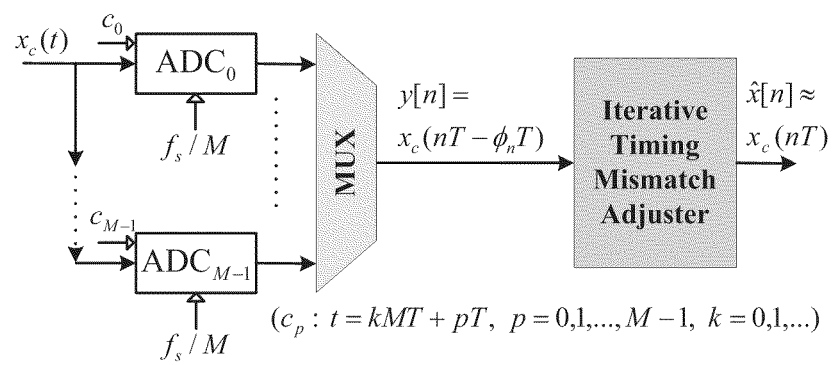
FIG. 5 is a block diagram illustrating an embodiment of an example implementation of an M-channel time-interleaved analog-to-digital converter.

FIG. 5 is a block diagram of an example implementation of an embodiment of a M-channel time-interleaved analog-to-digital converter with iterative timing mismatch being addressed at least in part. In an M-channel TI ADC, M ADCs may be operated in parallel, but sampling instants between two adjacent ADCs may differ by their clock period. Ideally, if M ADCs are nearly identical functionally and channel output signal sample values are combined appropriately, an equivalent high-speed ADC should provide at least similar or approximately the same precision as channel ADCs, but offering a speed M times faster. However, small mismatches between M ADCs may lead to degraded performance. TI ADCs may provide time-skew between different subconverters. If time-skew for channel ADCs remains relatively stable over a period, however, this may be satisfactorily employed in connection with periodic nonuniform sampling as follows:

$$\phi_n = \phi_{n+M}, \text{ for all } n,$$

which belongs to a subclass of nonuniform sampling as shown in FIG. 1(*b*). Implementations or example embodiments of iterative methods or structures may therefore be applied to at least in part address timing mismatch in TI ADCs.

Figure 6:
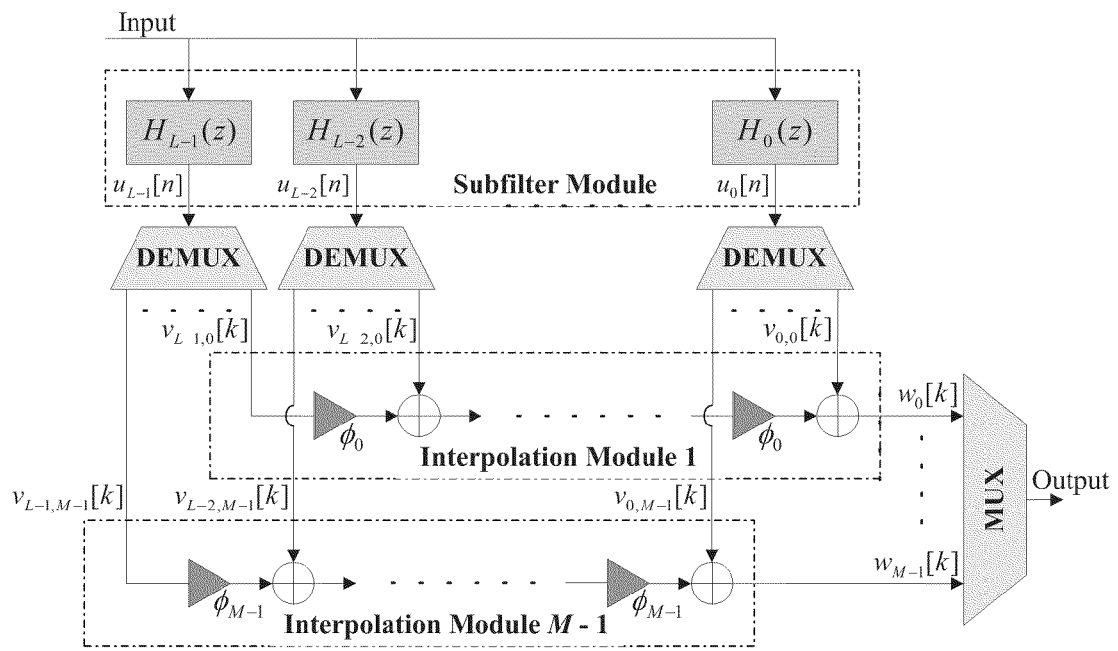
FIG. 6 is a block diagram illustrating an embodiment of a modified Farrow structure for an example implementation of a variable digital filter for periodic nonuniform sampling.

Making use of periodicity of a nonuniform sampling pattern, for example, FIG. 6 is a block diagram of an embodiment for an example implementation. Although claimed subject matter is not limited in scope in this respect, an implementation may include a modified Farrow structure. For example, an implementation may include A subfilter module arranged to calculate subfilter output sequences $u_l[n]$ of digital signal sample values by filtering an input sequence of digital signal sample values using subfilters $H_l(z), l=0, \ldots, L-1$, respectively.

L demultiplexers arranged to divide respective subfilter output sequences $u_l[n]$ of digital signal sample values to form M subsequences $v_{l,m}[n], m=0, \ldots, M-1$, of digital signal sample values in a cyclic manner so that data rate is lowered by a factor of M.

M interpolation modules arranged to calculate respective interpolated subsequences $w_m[n]$ of digital signal sample values by calculating a signal sample value of a respective polynomial of degree L–1 evaluated at $\phi_m$, where coefficients in ascending powers of the polynomial are given by demultiplexed subsequences $v_{l,m}[n]$ of digital signal sample values where $l=0, \ldots, L-1$.

A multiplexer arranged to combine M interpolated subsequences $w_m[n]$ of digital signal sample values to form a desired output sequence of digital signal sample values.

In an interpolation module, an embodiment, for example, multiplication with respective tuning parameter $\phi_m$, per unit time may be reduced by a factor of M. For example, a power-consuming module may be operated at a subconverter data rate.

In yet another embodiment, to speed-up the iterative process, iterative timing mismatch may be addressed as shown in FIG. 5 through a pipelined implementation such that a pipeline stage may comprise one iteration, as shown in FIG. 3, for example.

Figure 7A:
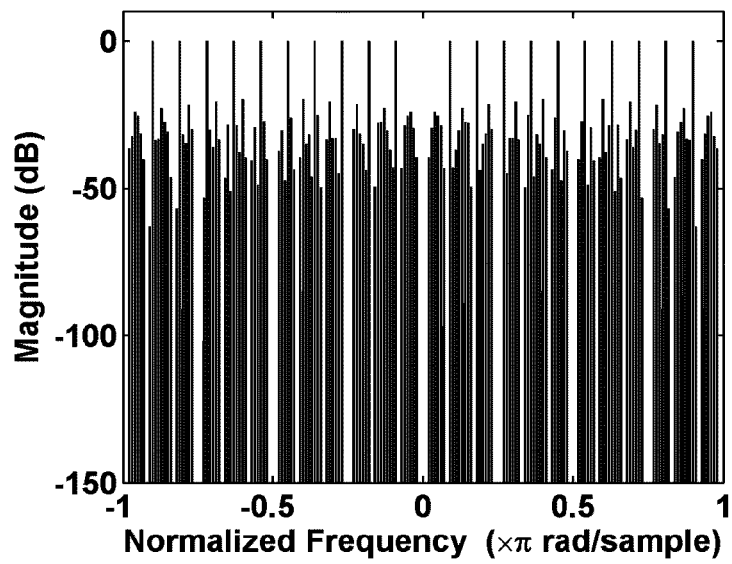
FIGS. 7(a) and 7(b) are signal plots to illustrate respectively a spectrum of a multi-sinusoidal signal before and after techniques are applied to address timing mismatch.
Figure 7B:
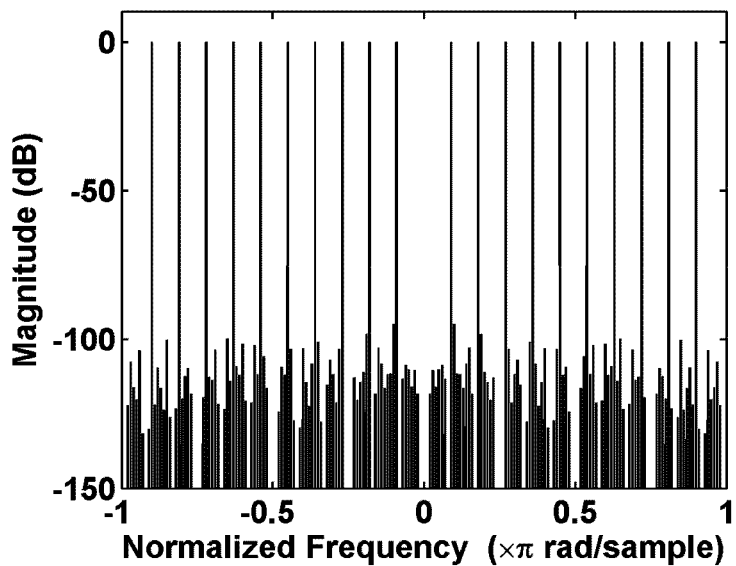

As still another example implementation, in an eight-channel TI ADC, using input digital signal sample values and a VFDDF, without limitation, FIG. 7(*a*) shows an uncorrected signal spectrum with timing offsets given by $\phi_0=0$, $\phi_1=0.05$, $\phi_2=0.1$, $\phi_3=-0.04$, $\phi_4=-0.08$, $\phi_5=0.07$, $\phi_6=0.02$ and $\phi_7=-0.06$. The plot shows that the largest aliasing component is about –19.6 dB. FIG. 7(*b*) shows the spectrum of a reconstructed signal which is obtained by passing an uncorrected signal through a VFDDF-based implementation in the form of RI four times. The largest aliasing component is reduced to about –95 dB as a result. Similar results are possible for embodiments of JI and GSI as previously described.

Figure 8:
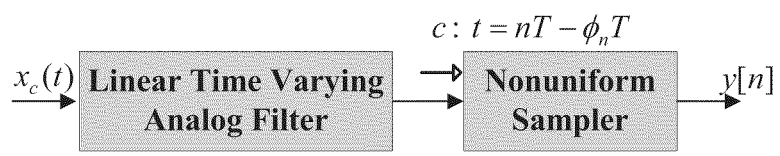
FIG. 8 is a block diagram illustrating an embodiment of an example implementation that includes a linear analog system.

In yet another embodiment, a linear time varying analog filter may be employed before a nonuniform sampler, such as the embodiment shown in FIG. 1(*c*). FIG. 8 comprise a block diagram illustrating an embodiment that includes a linear time varying analog filter implementation, although claimed subject matter is not limited in scope to this particular example implementation. One advantage of this particular example implementation includes that the relationship in (6) may made more general:

$$y=ABx,$$

where B comprises DT description or representation of a linear time varying analog filter system. Thus, for example, assuming AB satisfies conditions mentioned earlier, iterative methods may be employed to determine x from y, similar to approaches previously discussed. A variety of processes may take this particular form; although, again, this is merely one example of an illustrative embodiment and claimed subject matter is not intended to be limited in scope to this example.

It is further noted that while the previous discussion has focused on embodiments involving signals employing one spatial domain, claimed subject matter is not so limited. Therefore, embodiments may include signals in two or three spatial domains, if desired. Furthermore, other multi-dimensional approaches may be employed beyond three dimensions, although additional dimensions typically will not comprise spatial dimensions.

In summary, implementations for digital filtering have been described with a nonuniformly sampled sequence $y[n]$ of digital signal sample values, which may be obtained by sampling a bandlimited continuous-time signal $x_c(t)$ at irregular time instants substantially according to $y[n]=x_c(nT-\phi_n T)$, where T comprises a sampling period and $|\phi_n| \le 0.5$. An embodiment is provided in which reconstruction of uniform samples from nonuniform samples may be constructed and an embodiment is provided where, likewise, a similar approach may be applied to address timing mismatch in M-channel time-interleaved (TI) analog-to-digital converters (ADCs). In one particular embodiment, a system of linear equations may be constructed to represent the relation of $x[n]$ and $y[n]$ using an approximation of the sinc function in a frequency range of interest, e.g., the signal bandwidth. For example, a CT signal $x_c(t)$ may be slightly oversampled. This approximation therefore leads to a variety of practical implementations of the system. Approximated sine series may be represented, for example, by coefficients of fractional delay digital filters. A system of linear equations may also be processed using iterative approaches.

Some embodiments may be implemented efficiently by variable digital filters based at least in part on a Farrow structure implementation, such as described, for example, in C. W. Farrow, "A Continuously Variable Digital Delay Element," in *Proc. IEEE ISCAS*, vol. 3, pp. 2641-2645, 1988. One advantage of a Farrow structure is that its coefficients may be varied in real-time to cope with possibly changing timing mismatch. Furthermore, it may be implemented relatively efficiently in hardware without multiplications, apart from a limited number of general purpose multipliers to implement tuning variables in a Farrow structure implementation. For application to timing mismatch in TI ADC, in one particular embodiment, a modified Farrow structure may be employed to accomplish multiplication with a tuning parameter at a subconverter data rate.

Although embodiments have been fully described with reference to accompanying drawings, it is to be noted that various changes or modifications, for example extension to two-spatial dimension signal reconstruction or three-spatial dimension signal reconstruction, for example, may be accomplished. Changes or modifications, whether apparent to one of ordinary skill in the art or not, are to be understood as being included within the scope of claimed subject matter.

The invention claimed is:

1. An integrated circuit comprising: a digital filter within said integrated circuit in a manner so as to be capable of performing an iterative filtering process during operation of said integrated circuit; said digital filter to receive substantially non-uniform digital signal samples; said digital filter to provide substantially uniform digital signal samples; said digital filter to further process said non-uniform digital signal sample values using a variable delay digital filter to recover said uniform digital signal sample values as part of said iterative process during operation of said integrated circuit.

2. The integrated circuit of claim 1, wherein said digital filter is part of an analog-to-digital converter.

3. The integrated circuit of claim 2, wherein said digital filter is used to address timing mismatch for time-interleaved analog-to-digital conversion.

4. The integrated circuit of claim 1, wherein at least one of the following is integrated within said integrated circuit (IC) so as to be performed during IC operation as part of said iterative filtering process: a Richardson iteration; a Jacobi iteration; a Gauss-Seidel iteration; or any combination thereof.

5. The integrated circuit of claim 1, wherein said digital filter is implemented without employing multiplication other than a limited number of general purpose multipliers.

6. The method of claim 1, wherein said digital signal samples to comprise digital signal samples of a two-spatial dimension or of a three-spatial dimension continuous time signal.

7. A method comprising: digital filtering substantially non-uniform digital signal sample values using a variable delay digital filter to implement an iterative filtering process; and outputting substantially uniform digital signal sample values from said iterative filtering process.

8. The method of claim 7, and further comprising: prior to said digital filtering, receiving said substantially non-uniform digital signal sample values.

9. The method of claim 7, wherein said substantially non-uniform digital signal sample values are obtained by sampling an analog signal.

10. The method of claim 9, wherein said analog signal is pre-filtered by a linear time varying analog filter.

11. The method of 7, and further comprising: employing said iterative filtering process with respect to a system of relationships to characterize the relation between said substantially uniform digital signal sample values and said substantially nonuniform digital signal sample values so as to determine a sequence to approximate said substantially uniform digital signal sample values.

12. The method of claim 11, wherein said system of relationships employs coefficients of a fractional delay digital filter to approximate an ideal frequency response.

13. The method of claim 12, wherein said fractional delay digital filter is realized as a finite duration impulse response (FIR) or an infinite duration impulse response (IIR) digital filter with fixed or variable coefficients.

14. The method of claim 11, wherein said iterative filtering process operates in a sample-by-sample manner.

15. The method of claim 14, wherein said iterative filtering process comprises at least one of the following: a Richardson iteration process; a Jacobi iteration process; a Gauss-Seidel iteration process; or any combination thereof.

16. The method of claim 14, wherein at least one of accuracy or computational speed of said digital filtering is adjusted by a factor resulting from a fractional shift of clock period for consecutive digital signal sample values.

17. The method of claim 7, wherein said digital filtering comprises: parallel digital sampling of M channels wherein sampling instants between two consecutive digital signal sample values are shifted by a fraction 1/M of a clock period.

18. The method of claim 17, wherein at least some of said channels include a sub-converter; and further comprising: processing said non-uniform system sample values to reduce time-skew between different subconverters.

19. A method comprising: employing an integrated circuit, to implement a digital filter, said digital filter having an input port and an output port; said input port of said digital filter to receive substantially non-uniform digital signal samples; said output port of said digital filter to provide substantially uniform digital signal samples; said digital filter to further iteratively process said non-uniform digital signal sample values using a variable delay digital filter to recover said uniform digital signal sample values, wherein said uniform digital signal sample values are utilized for ADC processing.

20. A system comprising: a digital filter to receive substantially non-uniform digital signal samples and to provide substantially uniform digital signal samples; said digital filter to further process said non-uniform digital signal sample values using a variable delay digital filter to iteratively recover said substantially uniform digital signal sample values; wherein said digital filter is structured to use iterative processes that comprise one or more variable digital filters, at least one of said variable digital filters comprising L subfilters and a tuning parameter to be implemented using a Farrow structure.

21. The system of claim 20, wherein said Farrow structure comprises: a subfilter arranged to calculate subfilter sequences $u_l[n]$ of digital signal sample values to process an input sequence of digital signal sample values with subfilters $H_l(z)$, l=0, . . . , L−1, respectively; and an interpolation filter arranged to calculate an output sequence of digital signal sample values to calculate a signal sample value of an expression evaluated at a given $\phi$, wherein coefficients in ascending powers of said expression are to be given by said sequences $u_l[n]$ of digital signal sample values.

22. The system of claim 21, wherein said interpolation filter is arranged to calculate an output sequence of digital signal sample values to calculate an signal sample value of a polynomial of degree L−1 to be evaluated at a given $\phi$, wherein coefficients in ascending powers of said polynomial are given by said sequences $u_l[n]$ of digital signal sample values.

23. The system of claim 22, wherein filtering operations in said subfilter module are to be implemented via adders and shift registers.

24. The system of claim 22, wherein said addition or shift operations are to be implemented via a sum-of-power-of-two coefficient representation and multiplier-block realization.

25. A signal converter system, comprising: an M-channel time-interleaved analog-to-digital converter, wherein M analog-to-digital subconverters with approximately similar speed are to be operated in parallel such that an output sampling rate is M times faster than that of one of said subconverters; and an iterative timing mismatch adjuster to be used to reduce timing mismatch of the output sequence from said M-channel time-interleaved analog-to-digital converter.

26. The system of claim 25, wherein said iterative timing mismatch adjuster is to be based at least in part on an iterative process including at least one of the following: a Richardson iteration process; a Jacobi iteration process; a Gauss-Seidel iteration process; or any combination thereof.

27. The system of claim 26, wherein said iterative timing mismatch adjuster comprises one or more variable digital filters, a variable filter comprising L subfilters and a tuning parameter $\phi$, and is to be implemented via a modified Farrow structure.

28. The system of claim 27, wherein said modified Farrow structure comprises: a subfilter arranged to calculate subfilter output sequences $u_l[n]$ to process an input sequence of digital signal sample values with subfilters $H_l(z)$, $l=0, \ldots, L-1$, respectively; L demultiplexers, at least one of said demultiplexers arranged to divide respective subfilter output sequences $u_l[n]$ of digital signal sample values to form M subsequences $v_{lm}[n]$, $m=0, \ldots, M-1$, of digital sample values in a cyclic manner such that data rate is lowered by a factor of approximately M; M interpolation filters, at least one of said interpolation filters arranged to calculate respective interpolated subsequences $w_m[n]$ of digital signal sample values to calculate respective signal sample values of a polynomial of degree L−1 evaluated at $\phi_m$, wherein coefficients in ascending powers of said polynomial are to be given by demultiplexed subsequences $v_{lm}[n]$, $m=0, \ldots, L-1$ of digital signal sample values; and a multiplexer arranged to combine M interpolated subsequences $w_m[n]$ of digital signal sample values to form a desired output sequence of digital signal sample values.

29. The system of claim 28, wherein said iterative timing mismatch adjuster is to be pipelined such that at least one pipeline stage is to be constructed to implement at least one iteration.

* * * * *